US008638105B2

(12) United States Patent
Martinelli

(10) Patent No.: US 8,638,105 B2
(45) Date of Patent: Jan. 28, 2014

(54) CELL TELEMETRY SAMPLE AND HOLD AMPLIFIER

(75) Inventor: Robert Matthew Martinelli, Murrieta, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/942,022

(22) Filed: Nov. 9, 2010

(65) Prior Publication Data

US 2012/0112926 A1 May 10, 2012

(51) Int. Cl.
*G01N 27/416* (2006.01)
*H04Q 9/00* (2006.01)

(52) U.S. Cl.
USPC ...................... 324/433; 340/870.07

(58) Field of Classification Search
USPC ........................ 320/118; 340/870.07; 324/433
See application file for complete search history.

(56) References Cited

U.S. PATENT DOCUMENTS

| 5,073,849 | A  | * | 12/1991 | Morris ....................... 363/21.03 |
| 6,717,391 | B2 | * | 4/2004  | Linkowsky et al. ............ 324/72 |
| 6,873,134 | B2 |   | 3/2005  | Canter et al. |
| 6,950,319 | B2 | * | 9/2005  | Huber et al. ................ 363/21.12 |
| 7,622,893 | B2 | * | 11/2009 | Williams ....................... 320/112 |
| 7,778,046 | B1 | * | 8/2010  | Cuk et al. ......................... 363/16 |
| 7,786,701 | B2 | * | 8/2010  | Altemose ....................... 320/136 |
| 7,800,342 | B2 | * | 9/2010  | Kobayashi et al. ........... 320/118 |
| 2011/0309795 | A1 | * | 12/2011 | Firehammer et al. ......... 320/118 |

* cited by examiner

*Primary Examiner* — M'Baye Diao
(74) *Attorney, Agent, or Firm* — Ameh IP; Lowell Campbell; Elahe Toosi

(57) ABSTRACT

A system and methods for cell telemetry are disclosed. An average magnetizing current in a sampling transformer is forced to about zero amperes by balancing volt-seconds using a voltage clamp mechanism. Furthermore, a pulse driven switch and a synchronized sampling switch are activated, and substantially simultaneously the voltage clamp mechanism deactivated.

20 Claims, 7 Drawing Sheets

| CELL VOLTAGE | ANALYSIS RESULTS | CALCULATED GAIN | CALCULATED OFFSET | CALCULATED OUTPUT | CALCULATED ERROR (mv) | UNCALIBRATED ERROR (mv) |
|---|---|---|---|---|---|---|
| -0.2000 | -0.1984 | 0.9989 | 0.0012 | -0.19858 | -0.18 | 0.0016 |
| 0.0000 | 0.0013 | 0.9989 | 0.0012 | 0.0012 | -0.1 | 0.0013 |
| 1.0000 | 1 | 0.9989 | 0.0012 | 1.0001 | 0.1 | 0.0000 |
| 2.0000 | 1.9988 | 0.9989 | 0.0012 | 1.999 | 0.2 | -0.0012 |
| 3.0000 | 2.9978 | 0.9989 | 0.0012 | 2.9979 | 0.1 | -0.0022 |
| 4.0000 | 3.9966 | 0.9989 | 0.0012 | 3.9968 | 0.2 | -0.0034 |
| 5.0000 | 4.9957 | 0.9989 | 0.0012 | 4.9957 | 0 | -0.0043 |

| VARIATIONS WITH RESPECT TO: | | | | OUTPUT VARIATION |
|---|---|---|---|---|
| MAGNETIZING INDUCTANCE (L) | 1mH | 2mH | 3mH | |
| OUTPUT VOLTAGE FOR Vcell = 4 (V) | 3.995 | 3.996 | 3.996 | < .1 mV |
| SAMPLING FREQUENCY (f) | 100 kHz | 200 kHz | 300 kHz | |
| OUTPUT VOLTAGE FOR Vcell = 4 (V) | 3.9962 | 3.996 | 3.9958 | < .1 mV |
| DUTY CYCLE (%) | 5% | 10% | 15% | |
| OUTPUT VOLTAGE FOR Vcell = 4 (V) | 3.9962 | 3.996 | 3.9958 | < .2 mV |
| HARNESS RESISTANCE (R) | 0 ohms | 2 ohms | 4 ohms | |
| OUTPUT VOLTAGE FOR Vcell = 4 (V) | 3.9969 | 3.9959 | 3.9952 | < 1 mV |
| | | | RSS Error | 1.04880885 |
| | | | EVA Error | 1.6 mV |

*FIG. 6*

CELL TELEMETRY SAMPLE AND HOLD AMPLIFIER

FIELD

Embodiments of the present disclosure relate generally to battery cell telemetry. More particularly, embodiments of the present disclosure relate to battery cell telemetry for cell voltage balancing.

BACKGROUND

Lithium ion batteries that operate at voltages higher than a single cell can provide are generally comprised of multiple cells. Lithium ion battery cells may function non-optimally when subjected to an over-voltage or under-voltage condition due to overcharging or undercharging. Over a life of a battery, a battery cell may develop an internal leakage resistance mismatched higher or lower relative to other battery cells. Over time, the mismatch in leakage current may cause one or more battery cells to become overcharged or undercharged. Overcharging a battery cell may result in a non-optimal condition due to high cell temperature that may result in non-optimal operation of the cell. Discharging the battery cell to zero volts or zero amp-hours of stored energy may make the battery cell inoperative.

SUMMARY

A system and methods for cell telemetry are disclosed. An average magnetizing current in a sampling transformer is forced to be about zero amperes by balancing volt-seconds using a voltage clamp mechanism. Furthermore, a pulse driven switch and a synchronized sampling switch are activated, and substantially simultaneously the voltage clamp mechanism is deactivated. Then, the pulse driven switch and the synchronized sampling switch are deactivated, and substantially simultaneously the voltage clamp mechanism activated. The respective circuits alternate according to a clock. In this manner, a small voltage floating on a high voltage source is accurately measured.

In a first embodiment, a cell telemetry sample and hold amplifier system comprises a sampling transformer, a pulse driven switch coupled to the sampling transformer, and a voltage clamp mechanism coupled to the sampling transformer. The cell telemetry sample and hold amplifier system further comprises driver means coupled to the pulse driven switch and the voltage clamp mechanism, and a synchronized sampling switch coupled to the sampling transformer. The cell telemetry sample and hold amplifier system further comprises drive circuits coupled to the pulse driven switch, the voltage clamp mechanism, and the synchronized sampling switch. The driver means is operable to drive the pulse driven switch and the voltage clamp mechanism. The voltage clamp mechanism is operable to balance volt-seconds and force an average magnetizing current in the sampling transformer to about zero amperes. The synchronized sampling switch is operable to electrically couple the sampling transformer to a sampling capacitor. The drive circuits are operable to simultaneously turn on the pulse driven switch and the synchronized sampling switch while turning the voltage clamp mechanism off.

In a second embodiment, a method for cell telemetry comprises forcing an average magnetizing current in a sampling transformer to about zero amperes by balancing volt-seconds using a voltage clamp mechanism. The method further comprises activating a pulse driven switch and a synchronized sampling switch, and substantially simultaneously deactivating the voltage clamp mechanism.

In a third embodiment, a method for using a cell telemetry sample and hold amplifier system receives an electric current from a battery cell at an input of a sampling transformer. The method further forces an average magnetizing current in the sampling transformer to about zero amperes by balancing volt-seconds using voltage clamp means. The method also activates a pulse driven switch and the synchronized sampling switch, and substantially simultaneously deactivates the voltage clamp means.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without limiting the breadth, scope, scale, or applicability of the disclosure. The drawings are not necessarily made to scale.

FIG. 6 is an illustration of an exemplary error analysis table for the cell telemetry sample and hold amplifier system of FIG. 2 according to an embodiment of the disclosure.

DETAILED DESCRIPTION

Figure 1:
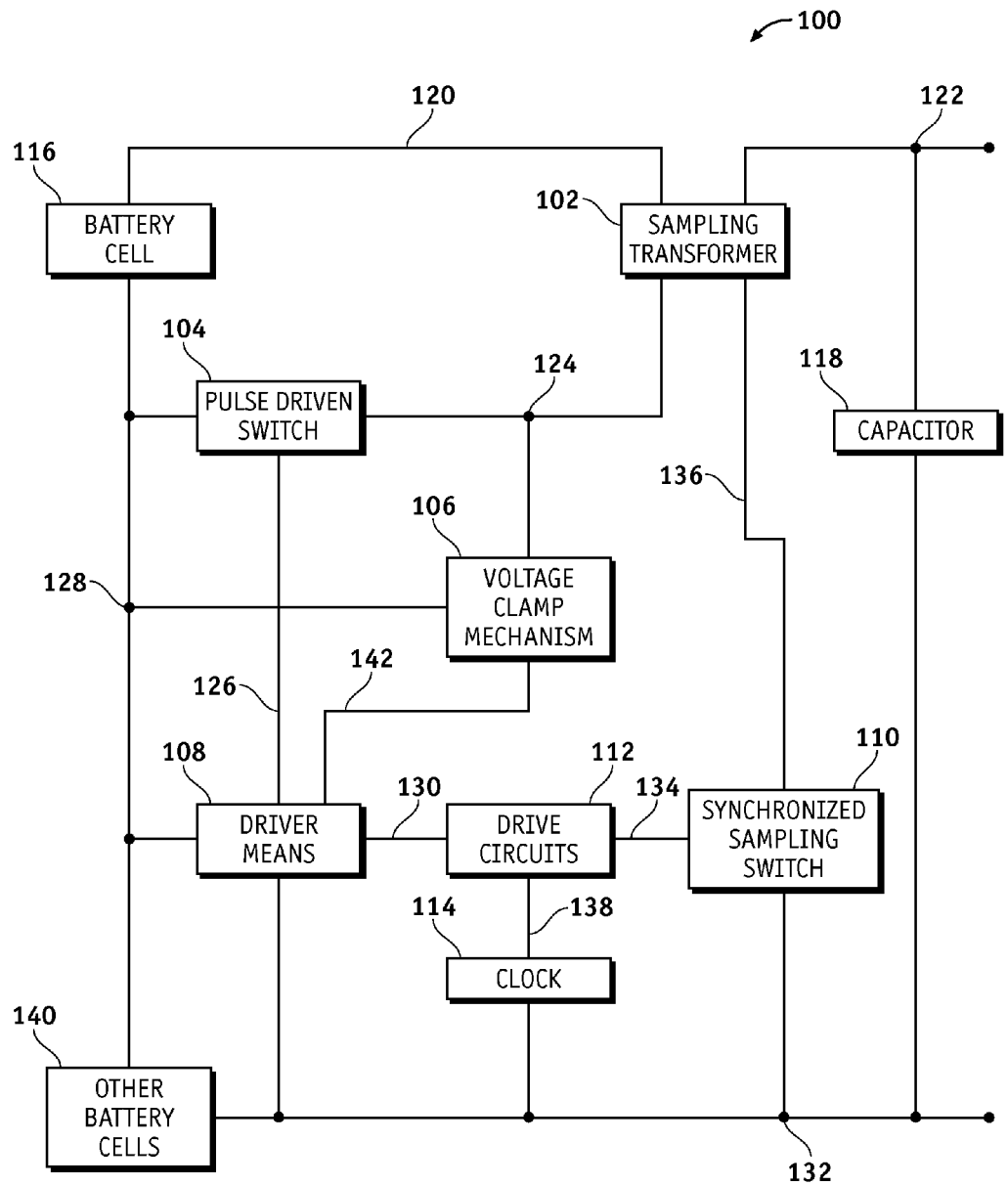
FIG. 1 is an illustration of a functional block diagram of an exemplary cell telemetry sample and hold amplifier system according to an embodiment of the disclosure.

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. Furthermore, there is no intention to be bound by any expressed or implied theory presented in the preceding field, background, summary or the following detailed description. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to, amplifiers, sample and hold circuits, telemetry, battery cell voltage measurement, and other functional aspects of the systems (and the individual operating components of the systems) may not be described in detail herein. In addition, those skilled in the art will appreciate that embodiments of the present disclosure may be practiced in conjunction with a variety of circuits, and that the embodiments described herein are merely example embodiments of the disclosure.

Embodiments of the disclosure are described herein in the context of a practical non-limiting application, namely, lithium-ion battery cell voltage measurement. Embodiments of the disclosure, however, are not limited to such lithium-ion battery, and the techniques described herein may also be utilized in other applications. For example but without limitation, embodiments may be applicable to lithium-ion battery cells, lithium-polymer battery cells, lithium-sulfur battery cells, fuel cells, other battery types, other rechargeable battery types, and the like.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

Sample and hold circuits are electronic devices generally used to measure a voltage of a varying analog signal. A sample and hold circuit samples the varying analog signal to obtain a voltage sample, and holds the voltage sample for measurement. Sample and hold circuits are generally used in analog-to-digital converters to measure low energy electronic signals. Embodiments of this disclosure provide a sample and hold circuit operable to accurately measure a voltage from a high voltage source, for example but without limitation, a lithium-ion battery cell.

FIG. 1 is an illustration of a functional block diagram of an exemplary cell telemetry sample and hold amplifier system 100 (system 100) according to an embodiment of the disclosure. The system 100 comprises a sampling transformer 102, a pulse driven switch 104, a voltage clamp mechanism 106, driver means 108, a synchronized sampling switch 110, and drive circuits 112.

The sampling transformer 102 is coupled to an external voltage source, such as but without limitation, a battery cell 116, other battery cells 140, and the like. The battery cell 116 and the other battery cells 140 may comprise, for example but without limitation, a lithium battery, and the like. The sampling transformer 102 is also coupled to an external circuit (not shown) operable to, for example but without limitation, use a voltage measured by the sampling transformer 102. The voltage measured by the sampling transformer 102 is stored on a sampling capacitor 118. The external circuit may comprise, for example but without limitation, cell balancing circuits that are used to balance a voltage of cells in a lithium-ion battery, and the like. The sampling transformer 102 is also coupled to the pulse driven switch 104, the voltage clamp mechanism 106, and the synchronized sampling switch 110.

Under a control of the pulse driven switch 104, the voltage clamp mechanism 106, and the synchronized sampling switch 110, the sampling transformer 102 represents a voltage on a first battery cell output 120 (i.e., voltage between 120 and 128) on the sampling transformer output 122 with substantially high accuracy and minimal current through the sampling transformer 102. In this manner, the voltage of the battery cell 116 can be accurately controlled/measured by measuring an output of the sampling transformer 102 as explained in more detail in the context of discussion of FIG. 3.

The pulse driven switch 104 is coupled to the voltage clamp mechanism 106 and the sampling transformer 102 by a common node 124. The pulse driven switch 104 is also coupled to and driven by the driver means 108 through a drive line 126. The pulse driven switch 104 selectively allows current to flow from the first battery cell output 120 (input 120 of the sampling transformer 102) and through the sampling transformer 102 to a second battery output 128 according to activation and deactivation by a first phase of a clock 114.

The voltage clamp mechanism 106 is coupled to the pulse driven switch 104 and the sampling transformer 102 by the common node 124. The voltage clamp mechanism 106 is also coupled to and driven by the driver means 108 through a drive line 142. The voltage clamp mechanism 106 is grounded to the second battery output 128. The voltage clamp mechanism 106 is operable to balance volt-seconds and force an average magnetizing current in the sampling transformer 102 to be about zero amperes.

The driver means 108 is coupled to the pulse driven switch 104 through the drive line 126 and the voltage clamp mechanism 106 through the drive line 142. The driver means 108 drives the pulse driven switch 104 to control the sampling transformer 102 according to activation and deactivation by the first phase of the clock 114. The driver means 108 drives the voltage clamp mechanism 106 to control the sampling transformer 102 according to activation and deactivation by a second phase of the clock 114. The second phase of the clock 114 is substantially out of phase with the first phase of the clock 114. The driver means 108 may comprise, for example but without limitation, a transformer comprising a primary winding (first induction coil) (not shown) coupled between a first output 130 of the drive circuits 112 and a common ground 132, and at least one secondary winding (second induction coil) (not shown) coupled between the drive line 126 and the second battery output 128. The at least one secondary winding may also be coupled between the drive line 142 and the second battery output 128. Alternatively, one of two secondary windings of the at least one secondary winding may also be coupled to the voltage clamp mechanism 106 through the drive line 142.

The synchronized sampling switch 110 is coupled to a second output 134 of the drive circuits 112 and a second coil output 136 of the sampling transformer 102. The synchronized sampling switch 110 is also grounded to the common ground 132. The synchronized sampling switch 110 electrically couples and electrically decouples the sampling transformer 102 to the sampling capacitor 118 according to activation and deactivation by the first phase of the clock 114. When the synchronized sampling switch 110 is activated by the first phase of the clock 114, the synchronized sampling switch 110 couples the sampling transformer 102 to the common ground 132, and current may flow to/from the common ground 132 through and under control of the second coil output 136 of the sampling transformer 102 and to/from the sampling capacitor 118. In this manner, the sampling transformer 102 is electrically coupled to the sampling capacitor 118. When the synchronized sampling switch 110 is deactivated by the first phase of the clock 114, the synchronized sampling switch 110 decouples the sampling transformer 102 to the common ground 132, and current may not flow to/from the common ground 132 through the second coil output 136 of the sampling transformer 102 and to/from the sampling capacitor 118. In this manner, the sampling transformer 102 is decoupled from the sampling capacitor 118.

The drive circuits 112 are coupled to the driver means and the synchronized sampling switch, and are operable to simultaneously turn "ON" the pulse driven switch 104 and the synchronized sampling switch 110 according to activation and deactivation by the first phase of the clock 114, while turning the voltage clamp mechanism 106 "OFF". Furthermore, the drive circuits 112 are operable to substantially simultaneously turn "OFF" the pulse driven switch 104 and the synchronized sampling switch 110 according to activation and deactivation by the second phase of the clock 114, while turning the voltage clamp mechanism 106 "OFF". The drive circuits 112 may be coupled to the clock 114 by a lead 138.

The clock 114 may comprise, for example but without limitation, a single phase clock, a bi-phase clock, and the like. A bi-phase clock is a clock whose signal is active in two different signal phases. For example, a single phase clock signal may be used as a bi-phase clock by using both the rising and falling edges of the clock signal by, for example but without limitation, coupling the signal to complimentary gates in a CMOS circuit, coupling the single phase clock to a transformer and using alternate polarity connections, and the like. The clock 114 may comprise, for example but without limitation, a single phase clock and bi-phase functionality may be derived via coupled connections to a driver means TX1 as described below in relation to the discussion of FIG. 3.

Figure 2:
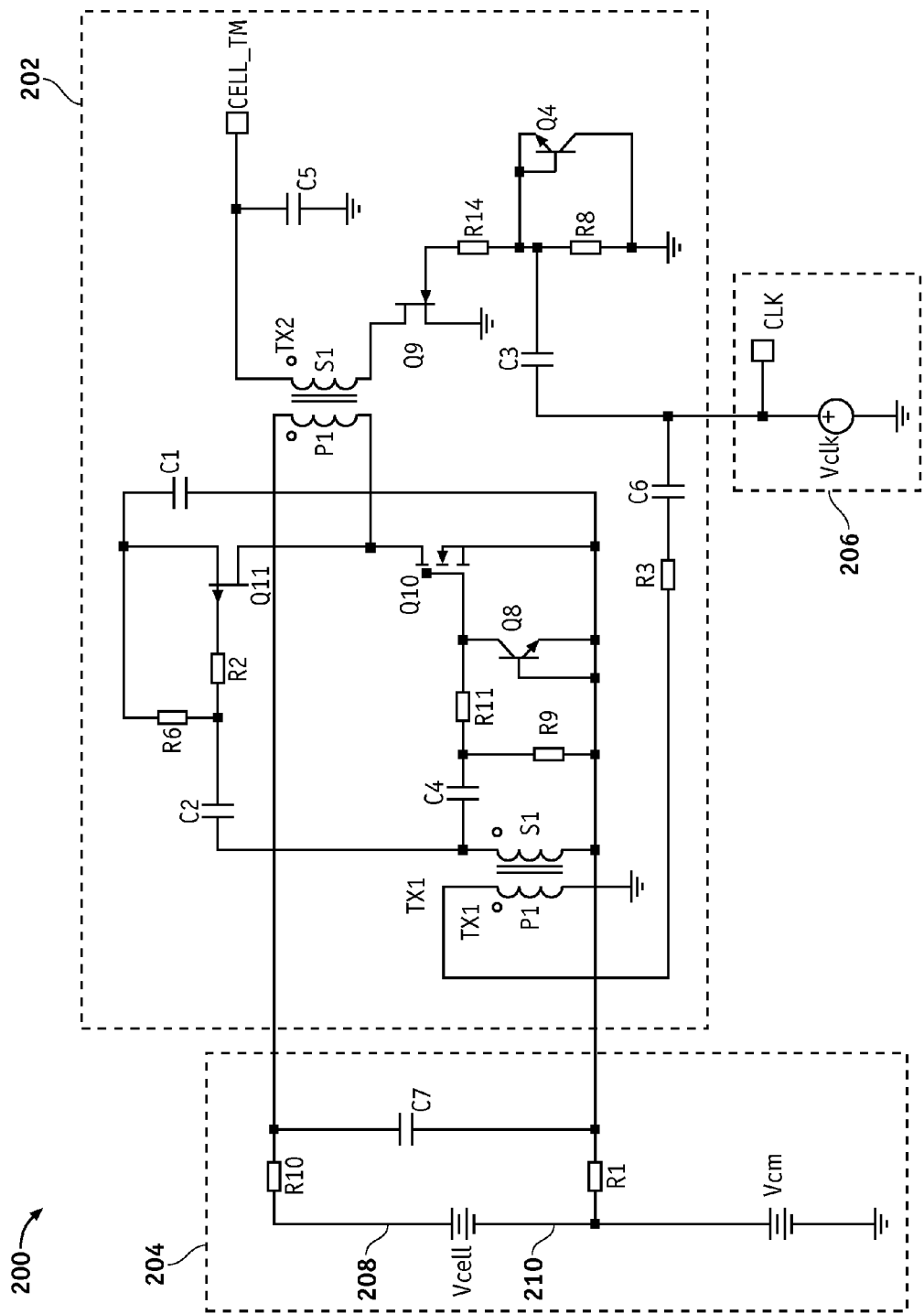
FIG. 2 is an illustration of an exemplary cell telemetry sample and hold amplifier system according to an embodiment of the disclosure.

FIG. 2 is an illustration of an exemplary cell telemetry sample and hold amplifier system 200 according to an embodiment of the disclosure. The cell telemetry sample and hold amplifier system 200 comprises a cell telemetry sample and hold amplifier circuit 202 (S/H circuit 202), a battery series 204, and a clock circuit 206.

The clock circuit 206 may comprise a duty cycle of, for example but without limitation, about 5%, about 10%, about 20%, or the like.

The battery series 204 comprises a series of battery cells at a voltage of, for example but without limitation, about 100V in combined voltage, and the like. The battery series 204 comprises two voltage sources that represent the series of battery cells. A first source represents a cell Vcell to be measured by the S/H circuit 202. A second source Vcm represents a series of 25 series connected cells. The cell Vcell may comprise a voltage of, for example but without limitation, about 4V and the like. The cell Vcell may be coupled to the S/H circuit 202 by lead lines 208/210 each comprising a resistance R1 and R10 respectively of, for example but without limitation, about 1 ohm, and the like. A capacitance C7 between the lead lines 208/210 may comprise, for example but without limitation, about 10 uF, and the like.

The S/H circuit 202 comprises a sampling transformer (TX2), a pulse driven switch (FET Q10), a voltage clamp mechanism (Q11 and C1), driver means (TX1) for driving the pulse driven switch (FET Q10), a synchronized sampling switch (Q9), and drive circuits (Vclk). The S/H circuit 202 may have functions, material, and structures that are similar to the embodiments shown in FIG. 1. Therefore common features, functions, and elements may not be redundantly described here.

A narrow clock pulse from drive circuits Vclk is transformer coupled by driver means TX1 to Q10 and Q11 to substantially simultaneously turn Q10 "ON" and Q11 "OFF". The narrow clock pulse is capacitively (i.e., via C3) coupled to Q9, and DC restored (i.e., via R14, R8 and Q4) to apply a drive voltage to Q9, so that Q9 turns "ON" at the same time as Q10. When both Q9 and Q10 are turned "ON", the cell voltage is applied to a primary winding P1 of the sampling transformer TX2. A secondary winding 51 of the sampling transformer TX2 is coupled to a capacitor C5, and charges a cell telemetry voltage CELL_TM to a voltage equal to the cell voltage Vcell.

When the clock pulse is low, Q9 and Q10 are turned "OFF" and Q11 is turned "ON". In a steady state (after many narrow clock pulses) the average voltage across the capacitor C1 increases to a voltage that substantially exactly balances the volt-seconds applied to the primary winding P1 of the sampling transformer TX2. When this balance of the volt-seconds occurs, a magnetizing current in the sampling transformer TX2 settles to a current that is near zero. Therefore, since on average the magnetizing current is zero, errors introduced by the magnetizing current flowing in various parasitic resistances associated with the "ON" time path from the battery cell to the primary of the sampling transformer TX2 are negligible.

Since the voltage on capacitor C1 self-adjusts to maintain a near "zero" magnetizing current, errors are not significantly affected by the inductance of the sampling transformer TX2, a switching frequency, or a magnitude of the cell voltage Vcell. Furthermore, the Vcell can be either slightly negative or positive and the accuracy is unaffected.

Each of the FETs Q9, Q10, Q11 may comprise circuits for removing a DC bias from their respective gates. For example but without limitation, Q9 may be coupled to resistors R8 and R14, and FET Q4 to remove DC bias from Q9 and C3 so Q9 properly responds to a clock signal from clock circuit 206. Q10 may be, for example but without limitation, coupled to resistors R9 and R11, and FET Q8 to remove DC bias so Q10 properly responds to a clock signal from secondary winding S1 of the transformer TX1. Q11 may be, for example but without limitation, coupled to resistors R2 and R6 to remove DC bias so Q11 properly responds to a clock signal from secondary winding S1 of the transformer TX1.

Resistors R1, R2, R3, R6, R8, R9, R10, R11, and R14 of the S/H circuit 202 may have the following resistances, for example but without limitation: R1 at about 1 ohm, R2 at about 1 k-ohms, R3 at about 100 ohms, R6 at about 100 k-ohms, R8 at about 100 k-ohms, R9 at about 20 k-ohms, R10 at about 1 ohm, R11 at about 10 ohms, and R14 at about 10 k-ohms. Capacitors C1, C2, C3, C4, C5, C6, and C7 of the S/H circuit 202 may have the following capacitances, for example but without limitation: C1 at about 470 nF, C2 at about 100 pF, C3 at about 500 pF, C4 at about 1 nF, C5 at about 100 nF, C6 at about 470 nF, and C7 at about 10 uF.

Figure 3:
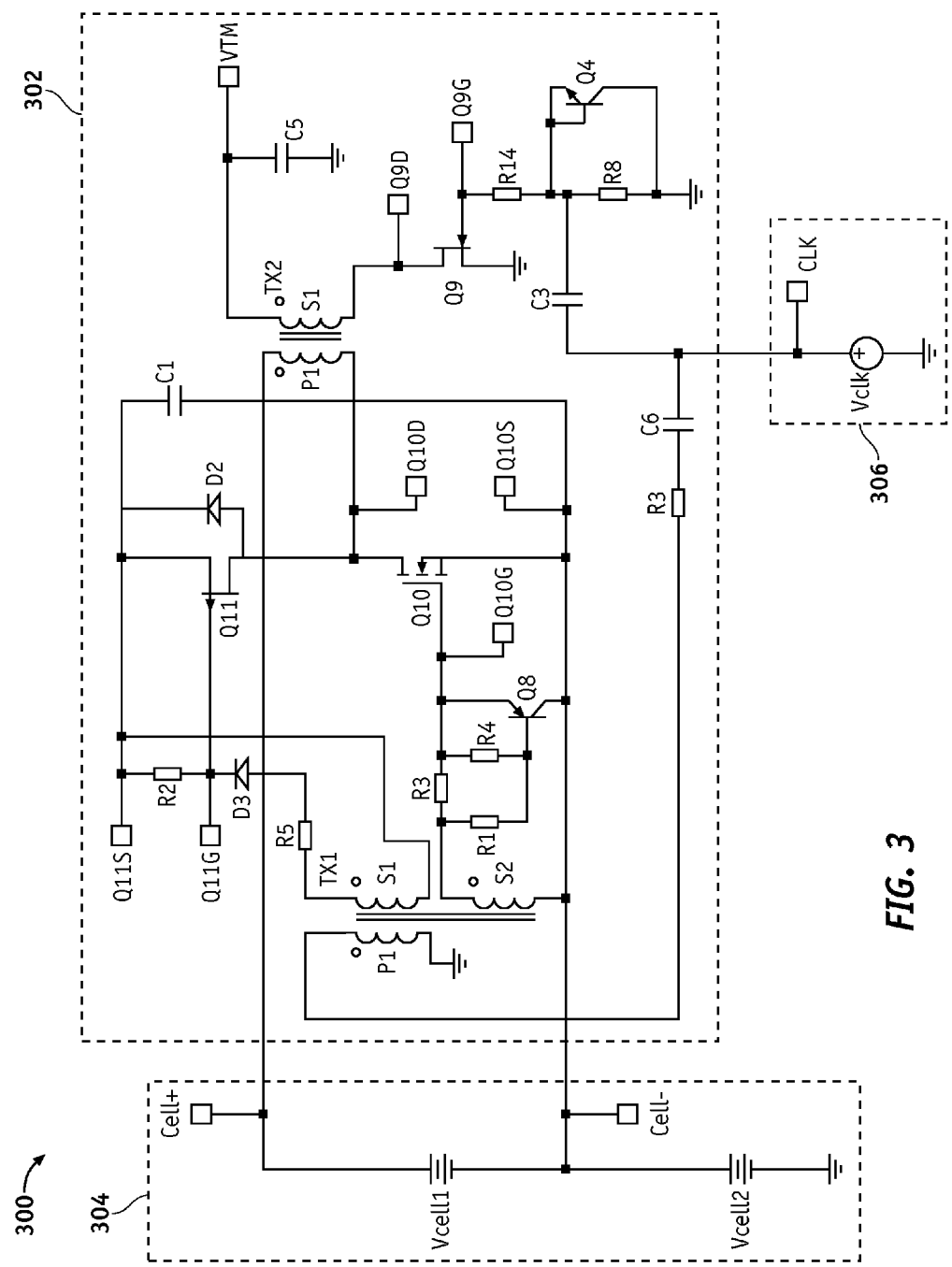
FIG. 3 is an illustration of an exemplary cell telemetry sample and hold amplifier system according to an embodiment of the disclosure.

FIG. 3 is an illustration of an exemplary cell telemetry sample and hold amplifier system 300 according to an embodiment of the disclosure. The cell telemetry sample and hold amplifier system 300 comprises a cell telemetry sample and hold amplifier circuit 302 (S/H circuit 302), a battery series 304, and a clock circuit 306.

The clock circuit 306 may have a duty cycle of, for example but without limitation, about 5%, about 10%, about 20%, or the like. The clock circuit 306 is capacitively coupled to a primary winding P1 of a transformer TX1 via a capacitor C6 and a resistor R3. The capacitor C6 and the resistor R3 may have, for example but without limitation, 470 nF capacitance and 100 ohms resistance respectively.

A secondary winding S2 of the transformer TX1 is coupled in phase with the primary winding P1 of the transformer TX1 and is coupled in phase via a gate Q10G and a source Q10S to a pulse driven switch (FET Q10). In this manner, the secondary winding S2 of the transformer TX1 is operable to substantially transfer a clock signal from the clock circuit 306 to the pulse driven switch (FET Q10) with a substantially same phase (first phase) as the clock signal.

A secondary winding S1 of the transformer TX1 is coupled in phase to the primary winding P1 of the transformer TX1 and is coupled in inverse phase via a gate Q11G and a source Q11S to a voltage clamp mechanism (Q11 and C1). In this manner, the secondary winding S1 of the transformer TX1 is operable to substantially transfer the clock signal from the clock circuit 306 to the voltage clamp mechanism (Q11 and C1) with a substantially inverse phase (second phase) as the clock signal.

The clock circuit 306 is also coupled (in phase) to a FET Q9 coupled between the secondary winding S1 of the transformer TX2 (i.e., at drain Q9D) and ground. In this manner, the pulse driven switch (FET Q10) are both activated in phase with the clock signal from the clock circuit 306, which allows the sampling transformer TX2 to operate in phase with the clock signal from the clock circuit 306. By having a short duty cycle of, for example but without limitation, about 10%, the clock signal from the clock circuit 306 may comprise a pulse that activates the sampling transformer TX2 for a substantially short period of time.

The battery series 304 comprises a series of battery cells at a voltage of, for example but without limitation, about 100V in combined voltage, and the like. The battery series 304 comprises two voltage sources that represent the series of battery cells. A first source represents a cell Vcell1 to be measured by the S/H circuit 302. A second source Vcell2 represents a series of 25 series connected cells. The cell Vcell1 may comprise a voltage of, for example but without limitation, about 4V and the like.

The S/H circuit 302 comprises the sampling transformer (TX2), a pulse driven switch (FET Q10), the voltage clamp mechanism (Q11 and C1), driver means for driving the pulse driven switch, a synchronized sampling switch (Q9), and drive circuits. The S/H circuit 302 may have functions, material, and structures that are similar to the embodiments shown in FIGS. 1-2. Therefore common features, functions, and elements may not be redundantly described here. The pulse driven switch (FET Q10) and the voltage clamp mechanism (Q11 and C1) are coupled to the sampling transformer (TX2) at node Q10D.

Sampling occurs during a time that a drive clock pulse of a drive clock CLK is high. A drive clock signal of the CLK is transformer coupled through TX1 to apply drive clock signals to Q10 and Q11. The drive clock pulse is capacitively coupled (i.e., via C3) and DC restored (i.e., via R14, R8 and Q4) to apply a drive voltage to Q9.

With the drive clock pulse high, Q9 and Q10 are turned "ON". When Q10 is "ON", Vcell1 is coupled to a primary winding P1 of the sampling transformer TX2. The output voltage at the secondary winding S1 of the sampling transformer TX2 is proportional to the voltage applied to the primary winding P1 of TX2. Since Q9 is turned "ON" at this time, the capacitor C5 charges to a voltage proportional to the cell voltage Vcell1. If the sampling transformer TX2 ratio is 1:1, then the output voltage VTM is nearly equal to the cell voltage between cell+ and cell−.

When a clock output of the CLK reaches zero, Q9 and Q10 are turned "OFF". Since Q9 is "OFF", the capacitor C5 will remain charged to the voltage established during the drive clock pulse of the CLK.

Also, when the clock output goes to zero, Q11 is turned "ON" connecting the sampling transformer TX2 between cell+ and Q11S which is also the positive side of C1. Over a number of cycles, a voltage at Q11S will charge up to a voltage greater than Vcell1 such that an average voltage across the sampling transformer TX2 is zero volts. Since the average voltage across the primary winding P1 of the sampling transformer TX2 is zero volts, the average current in the magnetizing inductance of the sampling transformer TX2 will also be zero. Therefore, the output voltage will not be significantly affected by parameter variations of the sampling transformer TX2 over temperature or life. Furthermore, the S/H circuit 302 will not be significantly affected by frequency variations or pulse-width variations of the clock CLK.

Each of the FETs Q9, Q10, Q11 may comprise circuits for removing a DC bias from their respective gates. For example but without limitation, Q9 may be coupled to resistors R8 and R14, and FET Q4 to remove DC bias from Q9 and C3 so Q9 properly responds to a clock signal from clock circuit 306. Q10 may be, for example but without limitation, coupled to resistors R1, R3, and R4, and FET Q8 to remove DC bias so Q10 properly responds to a clock signal from secondary winding S2 of the transformer TX1. Q11 may be, for example but without limitation, coupled to resistors R2 and R5, and diode D3 to remove DC bias so Q11 properly responds to a clock signal from secondary winding S1 of the transformer TX1.

Resistors R1, R2, R3, R4, R5, R8, and R14 of the S/H circuit 302 may have the following resistances, for example but without limitation: R1 at about 1 k-ohm, R2 at about 10 k-ohms, R3 at about 100 ohms, R4 at about 1 k-ohms, R5 at about 100 ohms, R8 at about 100 k-ohms, and R14 at about 10 k-ohms. Capacitors C1, C2, C3, C4, C5, C6, and C7 of the S/H circuit 302 may have the following capacitances, for example but without limitation: C1 at about 470 nF, C2 at about 100 pF, C3 at about 500 pF, C4 at about 1 nF, C5 at about 100 nF, C6 at about 470 nF, and C7 at about 10 uF.

Figures 4, 5:
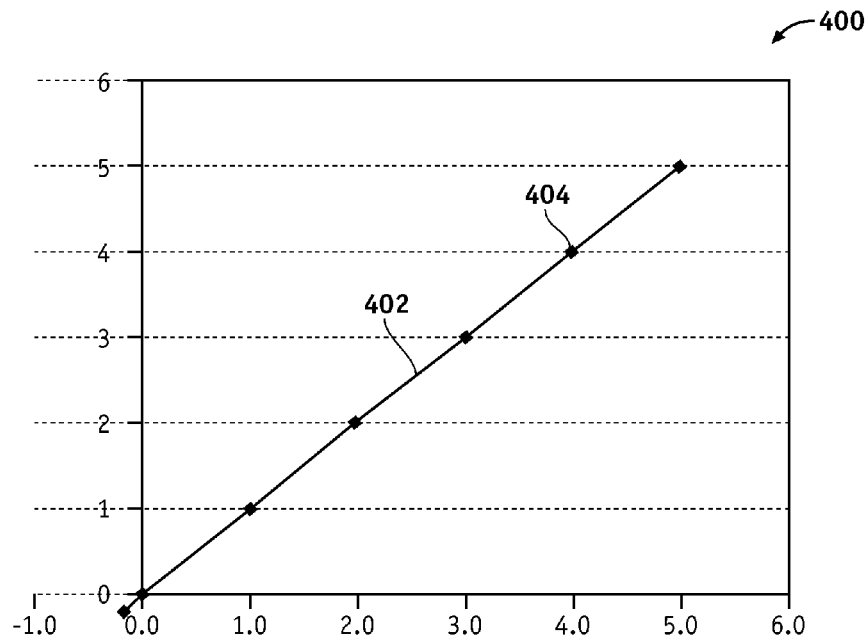
FIG. 4 is an illustration of an exemplary gain curve graph for the cell telemetry sample and hold amplifier system of FIG. 2 according to an embodiment of the disclosure.
FIG. 5 is an illustration of an exemplary table of telemetry (TM) voltage analysis result for the cell telemetry sample and hold amplifier system of FIG. 2 according to an embodiment of the disclosure.

FIG. 4 is an illustration of an exemplary gain curve graph 400 for the cell telemetry sample and hold amplifier system 200 showing TM voltage output vs. cell voltage according to an embodiment of the disclosure. FIG. 4 shows a linearity of the TM voltage output 404. As the cell voltage is varied from −0.2V to +5V, the TM voltage output 404 is matched to the calibration curve 402 (Y=0.99989x+0.0012, a straight line equation) within +/−0.2%. If no calibration is performed, the TM voltage output 404 would still match the cell voltage within—about 0.2 to 4.3 mV as shown below in table 500.

FIG. 5 is an illustration of an exemplary table 500 of TM voltage analysis result for the cell telemetry sample and hold amplifier system 200 according to an embodiment of the disclosure. Table 500 shows cell voltage 502, analysis results 504, calculation gain 506, calculated offset 508, calculated output 510, calibrated error 512, and un-calibrated error 514.

FIG. 6 is an illustration of an exemplary error analysis table 600 for the cell telemetry sample and hold amplifier system 200 according to an embodiment of the disclosure. Table 600 shows output voltage variation 620 with respect to input parameters 602 at Vcell equal to 4V. Variation in the magnetizing inductance 604 varies the Vcell 606 resulting in <0.1 mV in output voltage variation 620. Similarly, variation in the sampling frequency 608 varies the Vcell 610 resulting in <0.1 mV in output voltage variation 620. Variation in the duty cycle 612 varies the Vcell 614 resulting in <0.2 mV in output voltage variation 620. And variation in the harness resistance 616 varies the Vcell 618 resulting in <1 mV in output voltage variation 620.

A root sum-of-squares (RSS) error 622 is about 1.0488. Based on the Central Limit Theorem, RSS combines statistical distributions of several design parameters into a single Gaussian distribution that characterizes a variability of a voltage variation. A worst-case performance can be defined as a 3σ (three standard deviations) value of the combined distribution of voltage.

An extreme value analysis (EVA) error 624 is about 1.6 mV. An EVA error analysis analyzes a combination of parameters at data corners (e.g., typical value, minimum value, and maximum value) that result in a worst case performance measure.

Figure 7:
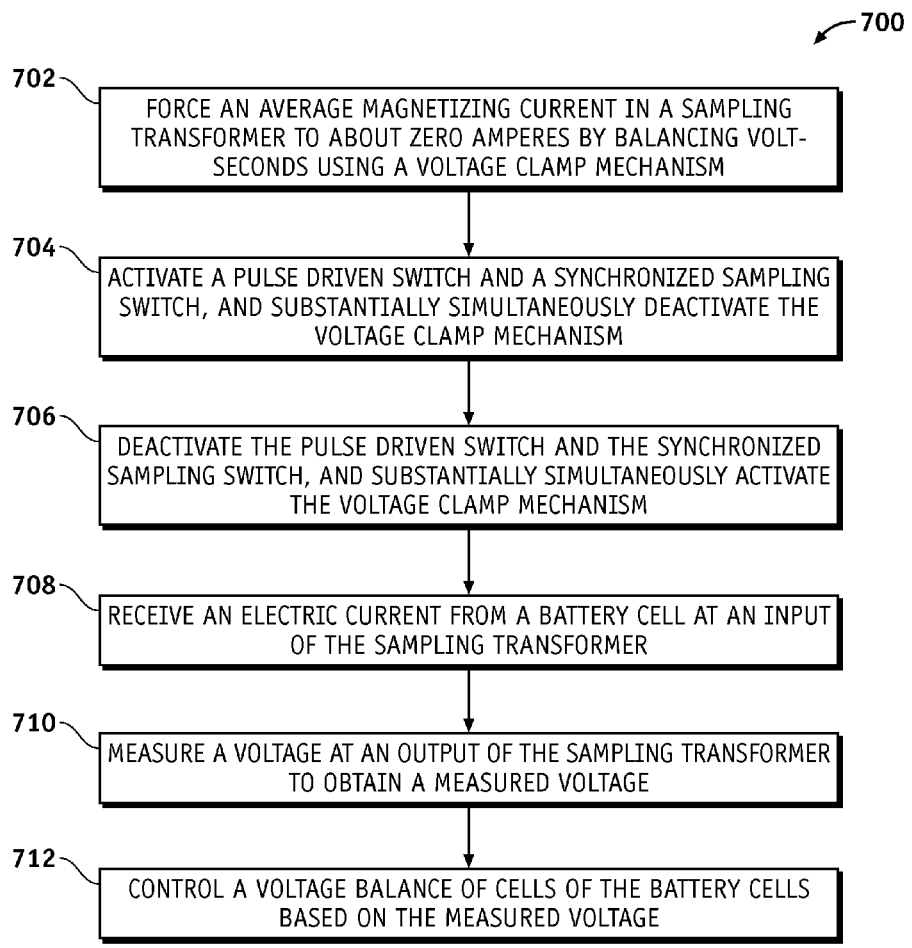
FIG. 7 is an illustration of an exemplary flowchart showing a cell telemetry process according to an embodiment of the disclosure.

FIG. 7 is an illustration of an exemplary flow chart showing a cell telemetry process 700 according to an embodiment of the disclosure. The various tasks performed in connection with process 700 may be performed mechanically, by software, hardware, firmware, or any combination thereof. It should be appreciated that process 700 may include any number of additional or alternative tasks, the tasks shown in FIG. 7 need not be performed in the illustrated order, and process 700 may be incorporated into a more comprehensive procedure or process having additional functionality not described in detail herein. For illustrative purposes, the following description of process 700 may refer to elements mentioned above in connection with FIGS. 1-6. In practical embodiments, portions of the process 700 may be performed by different elements of the system 100 (FIG. 1) such as: the sampling transformer 102, the pulse driven switch 104, the voltage clamp mechanism 106, the driver means 108, the synchronized sampling switch 110, the drive circuits 112. Process 700 may have functions, material, and structures that are similar to the embodiments shown in FIGS. 1-6. Therefore common features, functions, and elements may not be redundantly described here.

Process 700 may begin by forcing an average magnetizing current in a sampling transformer 102 to be near about zero amperes by balancing volt-seconds using a voltage clamp mechanism 106 (task 702).

The process 700 may continue by activating a pulse driven switch 104 and a synchronized sampling switch 110, and substantially simultaneously deactivating the voltage clamp mechanism 106 (task 704).

The process 700 may continue by deactivating the pulse driven switch 104 and the synchronized sampling switch 110, and substantially simultaneously activating the voltage clamp mechanism 106 (task 706).

The process 700 may continue by receiving an electric current from a battery cell 116 at the input 120 of the sampling transformer 102 (task 708).

The process 700 may continue by measuring a voltage at an output of the sampling transformer 102 to obtain a measured voltage (task 710).

The process 700 may continue by controlling a voltage balance of cells of the battery cells 116 based on the measured voltage (task 712).

Figure 8:
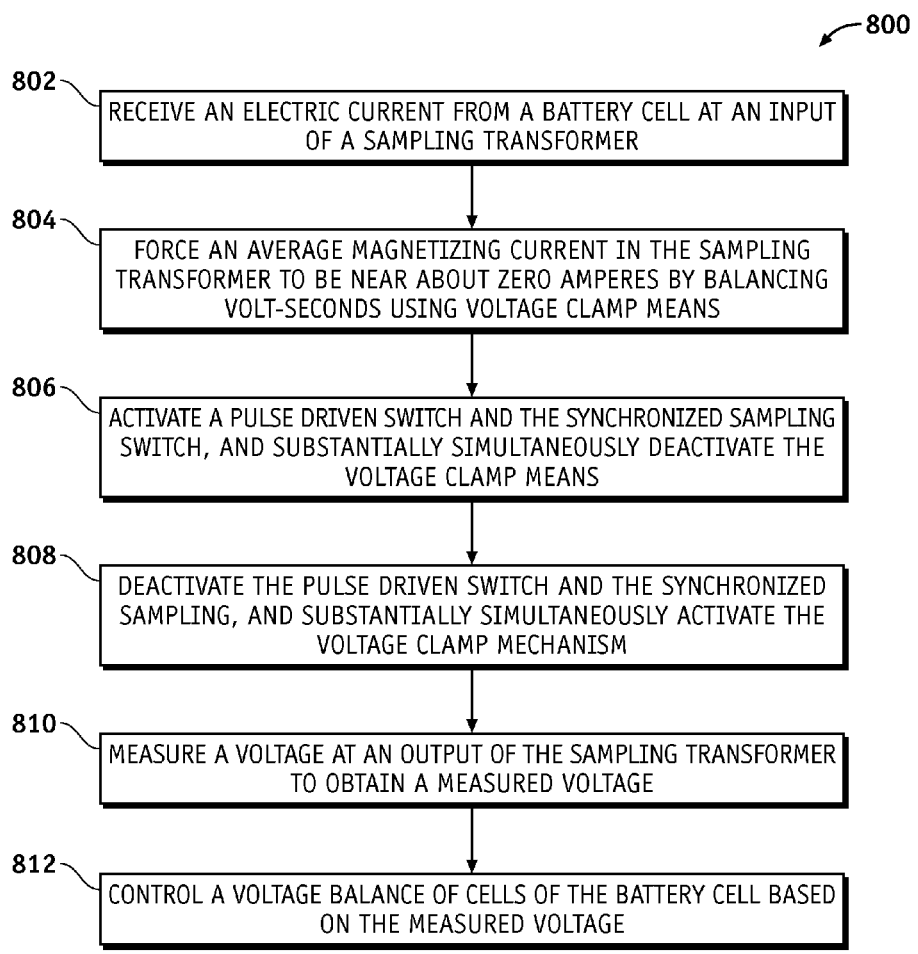
FIG. 8 is an illustration of an exemplary flowchart showing a process for using a cell telemetry sample and hold amplifier system according to an embodiment of the disclosure.

FIG. 8 is an illustration of an exemplary flowchart showing a process 800 for using a cell telemetry sample and hold amplifier system according to an embodiment of the disclosure. The various tasks performed in connection with process 800 may be performed mechanically, by software, hardware, firmware, or any combination thereof. It should be appreciated that process 800 may include any number of additional or alternative tasks, the tasks shown in FIG. 8 need not be performed in the illustrated order, and process 800 may be incorporated into a more comprehensive procedure or process having additional functionality not described in detail herein. For illustrative purposes, the following description of process 800 may refer to elements mentioned above in connection with FIGS. 1-7. In practical embodiments, portions of the process 800 may be performed by different elements of the system 100 (FIG. 1) such as: the sampling transformer 102, the pulse driven switch 104, the voltage clamp mechanism 106, the driver means 108, the synchronized sampling switch 110, and the drive circuits 112. Process 800 may have functions, material, and structures that are similar to the embodiments shown in FIGS. 1-7. Therefore common features, functions, and elements may not be redundantly described here.

Process 800 may begin by receiving an electric current from the battery cell 116 at the input 120 of a sampling transformer 102 (task 802).

Process 800 may continue by forcing an average magnetizing current in the sampling transformer 102 to be near about zero amperes by balancing volt-seconds using voltage clamp mechanism 106 (task 804).

Process 800 may continue by activating a pulse driven switch 104 and the synchronized sampling switch 110, and substantially simultaneously deactivating the voltage clamp mechanism 106 (task 806).

Process 800 may continue by deactivating the pulse driven switch and the synchronized sampling switch 110, and substantially simultaneously activating the voltage clamp mechanism 106 (task 808).

Process 800 may continue by measuring a voltage at an output of the sampling transformer 102 to obtain a measured voltage (task 810).

Process 800 may continue by controlling a voltage balance of cells of the battery cell 116 based on the measured voltage (task 812).

In this way, voltage from a high voltage source is accurately measured.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 1-3 depict example arrangements of elements, additional intervening elements, devices, features, or components may be present in an embodiment of the disclosure.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A cell telemetry sample and hold amplifier system comprising:
   a telemetry sampling transformer comprising a primary winding operable to couple to a battery and a secondary winding operable to couple to a sampling capacitor and output a measured telemetry voltage;
   a pulse driven switch coupled to the primary winding of the telemetry sampling transformer;
   a voltage clamp mechanism coupled to a winding of the telemetry sampling transformer and operable to balance volt-seconds applied to the winding of the telemetry sampling transformer and force an average magnetizing current in the telemetry sampling transformer to about zero amperes;
   driver means coupled to the pulse driven switch and the voltage clamp mechanism, and operable to drive the pulse driven switch and the voltage clamp mechanism;
   a synchronized sampling switch coupled to the secondary winding of the telemetry sampling transformer and operable to electrically couple the secondary winding of the telemetry sampling transformer to the sampling capacitor; and
   drive circuits coupled to the pulse driven switch, the voltage clamp mechanism, and the synchronized sampling switch, and operable to simultaneously turn on the pulse driven switch and the synchronized sampling switch while turning the voltage clamp mechanism off.

2. The cell telemetry sample and hold amplifier system according to claim 1, wherein the drive circuits are further operable to turn off the pulse driven switch and the synchronized sampling switch while turning on the voltage clamp mechanism simultaneously.

3. The cell telemetry sample and hold amplifier system according to claim 1, wherein the drive circuits comprise a clock coupled thereto.

4. The cell telemetry sample and hold amplifier system according to claim 1, further comprising a battery coupled to the telemetry sampling transformer.

5. The cell telemetry sample and hold amplifier system according to claim 4, wherein the battery comprises at least one of the group consisting of: a lithium battery, a lithium-ion battery, a lithium-polymer battery, a lithium-sulfur battery, and a fuel cell.

6. A method for cell telemetry, the method comprising:
   forcing an average magnetizing current in a telemetry sampling transformer to about zero amperes by balancing volt-seconds applied to a winding of the telemetry sampling transformer using a voltage clamp mechanism; and
   activating a pulse driven switch and a synchronized sampling switch, and simultaneously deactivating the voltage clamp mechanism; and
   outputting a measured telemetry voltage from the telemetry sampling transformer.

7. The method according to claim 6, further comprising deactivating the pulse driven switch and the synchronized sampling switch, and simultaneously activating the voltage clamp mechanism.

8. The method according to claim 7, further comprising receiving an electric current from a battery cell at an input of the telemetry sampling transformer.

9. The method according to claim 8, further comprising measuring a voltage at an output of the telemetry sampling transformer to obtain a measured voltage.

10. The method according to claim 9, further comprising controlling a voltage balance of cells of a battery based on the measured voltage.

11. The method according to claim 10, wherein the battery comprises at least one of the group consisting of: a lithium battery, a lithium-ion battery, a lithium-polymer battery, a lithium-sulfur battery, and a fuel cell.

12. The method according to claim 6, wherein:
   the pulse driven switch and the synchronized sampling switch are driven by a first signal; and
   the voltage clamp mechanism is driven by a second signal.

13. The method according to claim 12, wherein:
   the first signal comprises a first phase of a clock; and
   the second signal comprises a second phase of the clock.

14. The method according to claim 6, wherein a synchronized sampling switch connects the telemetry sampling transformer to a sampling capacitor.

15. A method for using a cell telemetry sample and hold amplifier system, the method comprising:
   receiving an electric current from a battery cell at an input of a telemetry sampling transformer;
   forcing an average magnetizing current in the telemetry sampling transformer to be about zero amperes by balancing volt-seconds applied to a winding of the telemetry sampling transformer using a voltage clamp mechanism; and
   activating a pulse driven switch and a synchronized sampling switch, and simultaneously deactivating the voltage clamp mechanism; and
   outputting a measured telemetry voltage from the telemetry sampling transformer.

16. The method according to claim 15, further comprising deactivating the pulse driven switch and the synchronized sampling switch, and simultaneously activating the voltage clamp mechanism.

17. The method according to claim 16, further comprising measuring a voltage at an output of the telemetry sampling transformer to obtain a measured voltage.

18. The method according to claim 17, further comprising controlling a voltage balance of cells of a battery based on the measured voltage.

19. The method according to claim 18, wherein the battery comprises at least one of the group consisting of: a lithium battery, a lithium-ion battery, a lithium-polymer battery, a lithium-sulfur battery, and a fuel cell.

20. The method according to claim 18, wherein the battery comprises a rechargeable battery.

* * * * *